(12) United States Patent
Chow et al.

(10) Patent No.: US 7,043,600 B2
(45) Date of Patent: May 9, 2006

(54) CASCADING CONTENT ADDRESSABLE MEMORY DEVICES WITH PROGRAMMABLE INPUT/OUTPUT CONNECTIONS

(75) Inventors: Nelson L. Chow, Mountain View, CA (US); Paul C. Cheng, San Jose, CA (US)

(73) Assignee: Integrated Silison Solution, Inc., Santa Clara, CA (US)

( * ) Notice: Subject to any disclaimer, the term of this patent is extended or adjusted under 35 U.S.C. 154(b) by 334 days.

(21) Appl. No.: 10/249,842

(22) Filed: May 12, 2003

(65) Prior Publication Data

US 2004/0230740 A1 Nov. 18, 2004

(51) Int. Cl.
*G06F 12/00* (2006.01)

(52) U.S. Cl. ........................................ 711/108; 713/160
(58) Field of Classification Search ................. 711/108; 713/160
See application file for complete search history.

(56) References Cited

U.S. PATENT DOCUMENTS

| | | | | |
|---|---|---|---|---|
| 5,841,874 A | * | 11/1998 | Kempke et al. | 713/160 |
| 5,930,359 A | * | 7/1999 | Kempke et al. | 713/160 |
| 6,148,364 A | * | 11/2000 | Srinivasan et al. | 711/108 |
| 6,219,749 B1 | * | 4/2001 | Schultz et al. | 711/108 |
| 6,301,636 B1 | * | 10/2001 | Schultz et al. | 711/108 |
| 6,493,793 B1 | * | 12/2002 | Pereira et al. | 711/108 |
| 6,521,994 B1 | * | 2/2003 | Huse et al. | 257/724 |
| 2003/0065880 A1 | * | 4/2003 | Gordon et al. | 711/108 |

OTHER PUBLICATIONS

Moors et al. "Cascading Content Addressable Memories," IEEE Micro, Jun. 1992, pp. 56–66.*
Ghose et al., "Response Pipelined CAM Chips: The First Generation and Beyond," IEEE 7th International Conference on VLSI Design, Jan., 1994, pp. 365–368.*
Smith et al., "the Tree–Match Chip," IEEE Transaction on Computers, vol. 40, No. 5, May 1991, pp. 629–639.*

* cited by examiner

*Primary Examiner*—Pierre Bataille
*Assistant Examiner*—Sheng-Jen Tsai
(74) *Attorney, Agent, or Firm*—Raymond E. Roberts; Intellectual Property Law Offices

(57) ABSTRACT

CAM devices that can be cascaded together to form CAM systems of different sizes are disclosed. The system has one or more clusters of M CAM devices, each device including (M−1) disable connections. Disable signals are used to avoid contention so that one CAM device generates the system output on a shared bus. To reduce pin count, the CAM device of priority N within each cluster has (N−1) of its disable connections programmed as inputs for disable-in signals received from higher-priority CAM devices, and its remaining (M−N) disable connections programmed as outputs for disable-out signals provided to lower-priority CAM devices. Some embodiments include two or more clusters of CAM devices and a controller. In some embodiments, the CAM system works as fast as a single CAM device. Some embodiments impose no architectural limits on the number of CAM devices that can be cascaded together.

14 Claims, 8 Drawing Sheets

550 ↘

| Cluster disable 355 | Disable in 342 | Device match 324 | Last device 472 | Search in progress 316 | Output control 455 |
|---|---|---|---|---|---|
| True | X | X | X | X | Tri-state |
| X | One or more true | X | X | X | Tri-state |
| X | X | False | False | X | Tri-state |
| False | All false or not present | True | X | X | Encoded row 322 |
| False | All false or not present | False | True | True | No-match value 412 |
| False | All false or not present | False | True | False | No-operation value 422 |

560 ↘

| Disable in 342 | Device match 324 | Cluster match 365 |
|---|---|---|
| One or more true | X | True |
| X | True | True |
| All false or not present | False | False |

FIG. 5

CASCADING CONTENT ADDRESSABLE MEMORY DEVICES WITH PROGRAMMABLE INPUT/OUTPUT CONNECTIONS

BACKGROUND OF INVENTION

Modern society and technology are increasingly based on information or data. Data of a wide variety of types is commonly stored or held, accessed or retrieved, and modified or updated. A variety of means are used to perform such operations—means ranging from time-tested paper and ink to state-of-the-art, high-technology electronic circuits.

For example, using a 2003 telephone book that includes Santa Clara, Calif. and looking for "Integrated Silicon Solution, Inc.," one can find the phone number "(408) 588-0800." Expressed in the terminology used to describe electronic memories, the telephone book is a content addressable memory (CAM). Finding a phone number is a lookup operation that matches entries held in the CAM with the key of the lookup operation, the key being "Integrated Silicon Solution, Inc." All entries within the CAM are searched in order to find those whose content matches the key. For this lookup operation, exactly one matching entry is found and the output is the phone number associated with that entry, i.e. "(408) 588-0800."

FIG. 1a is a functional diagram of the input, output and contents of a first example content addressable memory (CAM) according to the background art. CAM 110 holds binary information, that is, information in the form of bits having one of two values, i.e. "0" or "1."

Binary CAM 110 includes four rows, each of which has an associated row number 112. Each row holds a data entry 114, which is a binary number; for example, the highest-priority or first row, that is row number 1, holds a data entry with the value of "1010." Key 120 is a binary value that is input to binary CAM 110. In response to receiving a value for key 120, binary CAM 110 produces a corresponding value for output 130.

FIG. 1b shows four example lookup operations that occur in binary CAM 110. During each lookup operation 140, binary CAM 110 receives an input key value 120, and in response generates an output value 130. In the first example lookup operation, the key value received is "1100" and the output is "3" because row number 3 is the only row whose content matches the key value, that is, is the same as the key value. In the second example lookup operation, the key value received is "1010" and the output is "1."

Both row number 1 and row number 2 match the key, but row number 1 has priority over row 2 because it has a smaller row number. Entries in a phone book are ordered alphabetically, but entries in electronic CAMs are generally ordered by priority, which is used to determine which of the matching entries to output when more than one entry matches a particular key.

In both the third and fourth example lookup operations, the output of binary CAM 110 is "Invalid" because no rows match either "1011" or "0001".

In some CAM systems, the row number output from binary CAM 110 is used as an address to be input to a standard memory, that is, a memory that holds data that is retrieved based on the address of the data within the memory. A standard memory could be used in order to hold the phone number, for example, of the entries within the CAM and to output the phone numbers of the $3^{rd}$, $1^{st}$ or $4^{th}$ entries based on binary CAM 110 outputting "3," "1" or "4."

FIG. 2a is a functional diagram of the input, output and contents of a second example content addressable memory (CAM) according to the background art. CAM 210 holds ternary information, that is, information in the form of bits having one of three values, i.e. "0," "1" or "either 0 or 1."

Each of the four entries held by ternary CAM 210 includes both data entry 216 and mask entry 218. Data entries 216 held in ternary CAM 210 have the same values as the data entries 116 within binary CAM 110. A bit with the value "1" within a mask entry 218 indicates that the entry held in that row "does not care about" the value of the key for that bit. For example, the entry in row 4 matches either the key value "1000" or the key value "1001".

FIG. 2b shows four example lookup operations that occur in ternary CAM 210. During each lookup operation 140, ternary CAM 210 receives as input a key value 120, and in response generates an output value 130. The example key values shown in FIG. 2b are the same as in FIG. 1b.

In the first, second and fourth example lookup operations, the outputs produced by ternary CAM 210 and the rationales for these outputs are unchanged from the example of FIGS. 1a and 1b.

However, in the third example lookup operation, the output of ternary CAM 210 is "2" because the entry in row number 2 matches either the value "1010" or the value "1011" because mask entry 218 for row 2 is "0001." This contrasts with binary CAM 110, which had no entry corresponding to a key value of "1011," and thus had an "Invalid" output.

A lookup process based on matching contents held in a CAM memory often occurs as a data packet is routed across a computer network. In fact, a data packet traveling along a complex network such as the Internet may trigger hundreds of such lookup operations. Computer networks often include switches, hubs, firewalls, gateways, concentrators or routers, which are collectively termed "routers" herein.

Consider an example in which a router receives a data packet containing part of a web page that is to be displayed on a destination computer. The router extracts from the data packet the network address of the destination computer, say for example, "87.134.242.159." Then the router uses the destination address, or part of the destination address, such as "87.134" or simply "159," as the key for a lookup operation in a CAM.

For network routing applications, the speed at which a CAM lookup operation occurs is critical. Displaying a single web page may involve tens of thousands of data packets. Hundreds of web page accesses and numerous other information streams may pass through a single router concurrently. It may be reasonable for a person to take a minute to look up a phone number, but a network router should perform many millions of CAM lookup operations each second.

For network routing applications, the flexibility of lookup operations is also critical. Thus, flexible CAM configurations are critical.

As an example of the need for flexibility, some routers use CAM lookup keys other than, or in addition to, the destination network address. Examples of data that may be included in a key include, among others, the type of the data packet, the size of the data packet, or the network address of the source of the data packet.

As another example, the network data stored in the CAM may include a wide variety of types of information. Such information may include, but is not limited to: i) network links outbound from a router over which packets are to be forwarded when addressed to a particular destination, or to a particular group of destinations; ii) priority or quality of network service information associated with a particular destination or packet type; iii) security information or access privileges; and iv) dynamically maintained load information. As yet another example of the need for flexibility, some routers vary as to the open system interconnection (OSI) layer or layers on which they operate.

For network routers, the capacity of a CAM system, that is the number of entries that it can hold, is also critical. As networks get larger, and networking routing applications grow, the size of the lookup tables that hold data about the network must grow in size commensurately. If the CAM devices used are not large enough to handle the number of entries in a lookup table, then CAM memory systems for network routers should be able to connect together multiple CAM devices.

Computer networks are not the only electronic devices that employ CAMs. Other applications include data storage networks and systems, video processing, computer graphics and data compression. Similar considerations for the speed, flexibility and capacity of CAM memory systems apply to these applications as well as to network routers.

SUMMARY OF INVENTION

Thus there is a need for content addressable memory (CAM) systems that are high in speed, large in capacity, and flexible in capacity, content and operation. The invention meets this need by providing a CAM device that can be cascaded. CAM systems can be formed from various numbers of CAM devices to hold various numbers of entries. In some embodiments of the invention, the CAM system works as fast as a single CAM device. Some embodiments of the invention impose no architectural limits on the number of CAM devices that can be cascaded together to operate as a single CAM system.

In some embodiments of the invention, the CAM system has one or more clusters, each cluster having M CAM devices. Each CAM device includes a CAM array that holds entries and determines if each entry matches the key of the current lookup operation. Each CAM device also includes (M−1) programmable disable connections. The CAM devices within each cluster have a priority N, which ranges from 1 to M. The CAM device of priority N has (N−1) of its disable connections programmed as inputs to receive disable-in signals from the (N−1) higher-priority CAM devices within the cluster. This CAM device has its remaining (M−N) disable connections programmed as outputs to provide a disable-out signal to the (M−N) lower-priority CAM devices within the cluster.

Each CAM device also includes a cascade circuit that disables the device from driving the bus when any of the disable-in signals received by the device are asserted.

Some embodiments of the invention include a controller and two or more clusters of CAM devices. The controller receives cluster-match signals from the clusters and generates cluster-disable signals for the clusters. The cluster-disable signal for a particular cluster is not asserted when there is not an asserted cluster-match signal that is received from a cluster that has higher priority than the particular cluster.

CAM devices for multi-cluster systems include two additional connections: one that receives the cluster-disable signal for the cluster containing the device and one that provides the cluster-match signal for that cluster. The cascade circuits in these CAM devices disable the device from driving the output onto the bus when the cluster-disable signal is asserted. These circuits also assert the cluster-match signal when a matching entry is found within the cluster.

These additional connections may be programmable in some multi-cluster CAM devices. When such a device is used to form a single-cluster CAM system, the additional connections can be configured to receive disable-in signals or to generate disable-out signals within the single cluster.

BRIEF DESCRIPTION OF DRAWINGS

Objects, features and advantages of the invention will become apparent from the descriptions and discussions herein, when read in conjunction with the drawing. Technologies related to the invention, example embodiments of the invention, and example uses of the invention are illustrated in the various figures of the drawing, which are as follows:

FIG. 5 illustrates some of the functions performed by portions of the cascade circuit of FIG. 4.

DETAILED DESCRIPTION

The descriptions, discussions and figures herein illustrate technologies related to the invention, show examples of the invention and give examples of using the invention. Known methods, procedures, systems, circuits, or elements may be illustrated and described without giving details so as to avoid obscuring the principles of the invention. On the other hand, details of specific embodiments of the invention are presented, even though such details may not apply to other embodiments of the invention.

Some descriptions and discussions herein use abstract or general terms including but not limited to match, equal, assert, "true" or "false". Those skilled in the art use such terms as a convenient nomenclature for components, data or operations within a computer, digital or electromechanical system. Such components, data and operations are represented by physical properties of actual objects including but not limited to electronic voltage, magnetic field and optical reflectivity. For example, "asserted" or "true" may refer to an electronic signal that is around 3 volts and "not asserted" or "false" may refer to a signal around 0.3 volts, or vice versa. Similarly, perceptive or mental terms including but not limited to determine, select, detect, compare and control may also refer to such components, data or operations or to manipulations of such physical properties.

Figure 3:
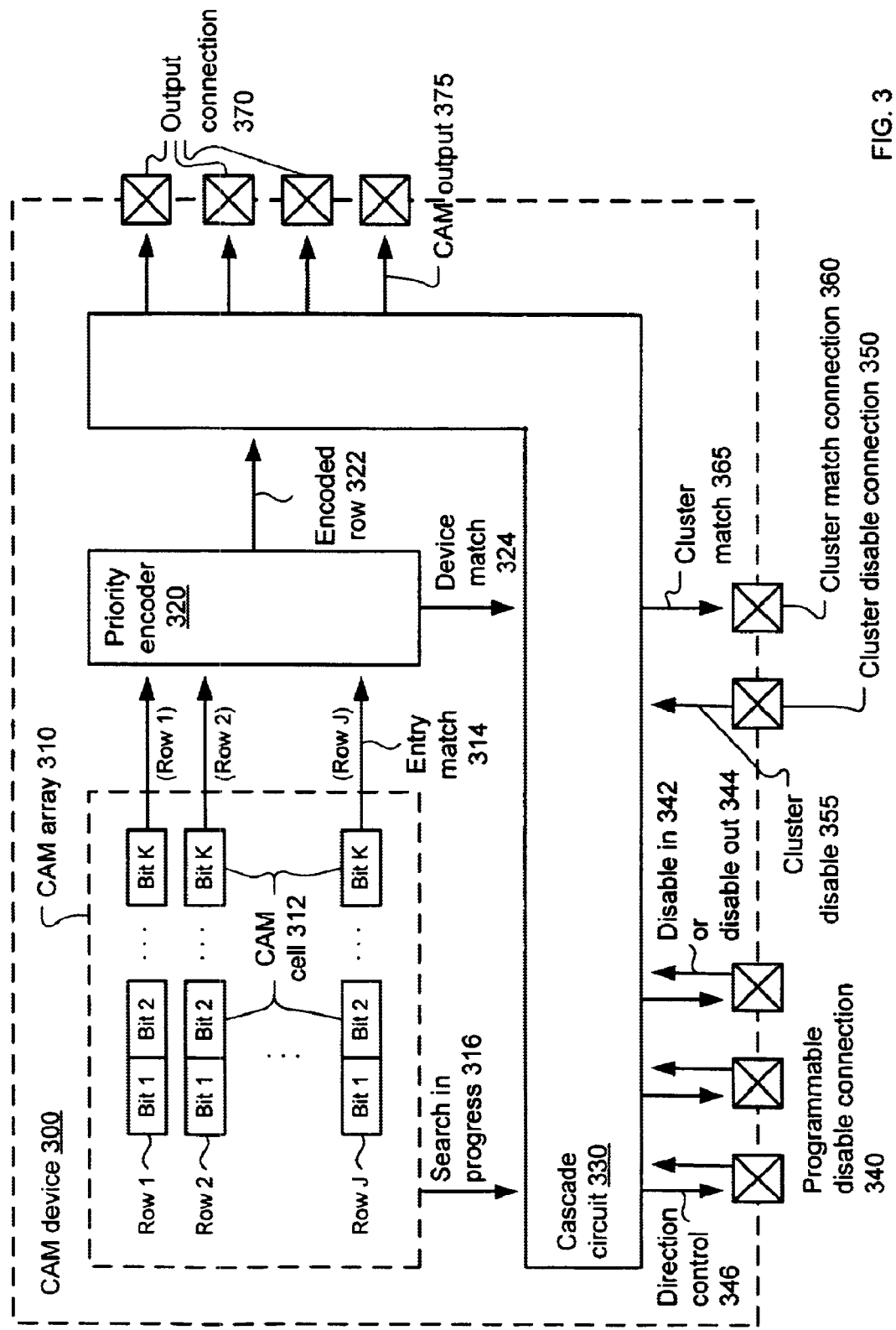
FIG. 3 shows the functional components and their interconnections in an exemplary CAM device according to an embodiment of the invention, where the CAM device can be cascaded to form a larger CAM system.

FIG. 3 is a functional block diagram of a CAM device, according to an embodiment of the invention. CAM device 300 can be cascaded with other instances of the same or similar devices to form a CAM memory system. Typically, but not necessarily, each instance of the device is implemented as a single integrated circuit. In response to receiving a key, each of the CAM devices that are cascaded together into a CAM system simultaneously searches the entries contained in the device. Disable signals are used to avoid contention so that exactly one CAM device generates the CAM system output on a bus that is shared among the devices.

The invention advantageously reduces the pin or connection count of the CAM devices. That is, each CAM device to be used in a cluster of M devices needs only (M−1) disable connections, because each connection can be independently programmed to either be an input connection or an output connection. The CAM device of priority N within each cluster has (N−1) of its disable connections programmed as inputs for disable-in signals received from higher-priority CAM devices, and its remaining (M−N) disable connections programmed as outputs for disable-out signals provided to lower-priority CAM devices.

The invention advantageously allows various numbers of instances of the same CAM device to be flexibly configured into a CAM system of varying size. This flexibility is achieved in the following two ways: First, various numbers of CAM devices, up to one more than the number of programmable disable connections that each device has, can be configured into a CAM cluster. Second, multiple clusters of CAM devices can operate together under the control of a controller that receives cluster-match signals and that generates cluster-disable signals.

CAM device 300 includes CAM array 310 of width K and depth J, priority encoder 320, and cascade circuit 330. The device also includes a number of connections by means of which signals enter or leave CAM device 300, including programmable disable connections 340. Programmable disable connections 340 can function either as input connections for disable-in signal 342, or as output connections for disable-out signal 344.

CAM array 310 comprises J rows, each of which includes K instances of CAM cell 312. Each row can hold a K-bit wide entry. Each row compares the entry held with the key of the current lookup operation, which is also K-bits. When the current value of an entry and the key match, then the row holding that entry asserts entry-match signal 314, that is, it generates the value "true" for the signal. The CAM array also generates search-in-progress signal 316, which is asserted when the CAM array is performing a lookup operation.

Priority encoder 320 receives an entry-match signal 314 corresponding to each row of CAM array 310. Based on the entry-match signals, the priority encoder generates encoded-row signal 322. If only one of the entry-match signals 314 is asserted, then the row number of that signal is the value of encoded-row signal 322.

However, it is possible for more than one entry held in a CAM memory system to match the key of a particular lookup operation. In this case, priority encoder 320 selects the row with the highest priority among those rows that have asserted entry-match signals, for example, the row with the lowest row number, or the row with the highest row number.

Priority encoder 320 also generates device-match signal 324, which is the logical OR of the entry-match signals 314 from all rows.

Signals enter and leave CAM device 300 by means of output connections 370 and programmable disable connections 340, and optionally by means of cluster-match connection 360 and cluster-disable connection 350. When enabled, output connections 370 drive CAM output signals 375 onto the output bus of the CAM system, otherwise output connections 370 are in a high-impedance or tri-state mode in which they do not affect the value that is driven onto the bus by another CAM circuit.

Under the control of direction-control signals 346, each programmable disable connection 340 can be individually programmed to function either as an input connection for disable-in signal 342 or as an output connection for disable-out signal 344. Versions of CAM device 300 designed for use in CAM memory systems having two or more clusters also include cluster-match connection 360 which provides cluster-match signal 365, and cluster-disable connection 350 which receives cluster-disable signal 355.

Cascade circuit 330 is a control circuit that receives the disable-in signals 342 (if any) received by a particular instance of CAM device 300, search-in-progress signal 316, encoded-row signal 322, device match signal 324, and cluster-disable signal 355. Cascade circuit 330 generates the disable-out signals 344 (if any) that are produced by the instance of CAM device 300, direction control signals 346, cluster-match signal 365 and CAM-output signal 375. Cascade circuit 330 is described herein with respect to FIGS. 4 and 5.

The priority encoder used in various embodiments of the invention may be any circuit or device that receives encode-request signals, that selects among those that are asserted, and that encodes the selected row. Any technique may be used to perform the selection. Any technique may be used to perform the encoding.

CAM array 310 and CAM cell 312 may be any circuit or device that can hold entries and generate entry-match signals based on comparing the entry value held with the value of the key for the current lookup operation. Numerous designs for and variation on memory arrays and CAM cells are known in the art and more are likely to be developed.

Figure 1A:
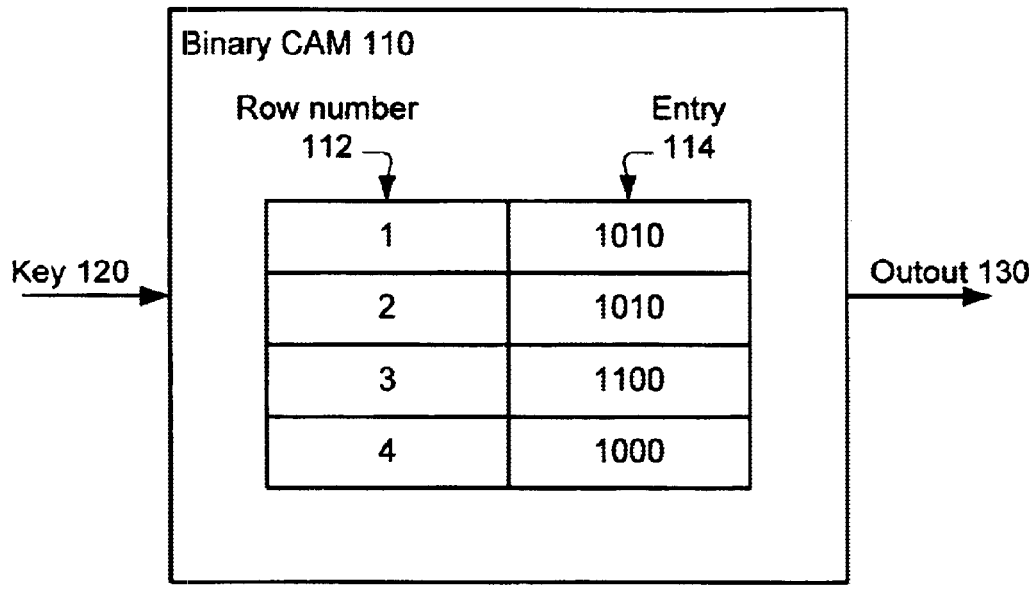
FIG. 1a shows a first example of a content addressable memory (CAM), which holds binary information.
Figure 1B:
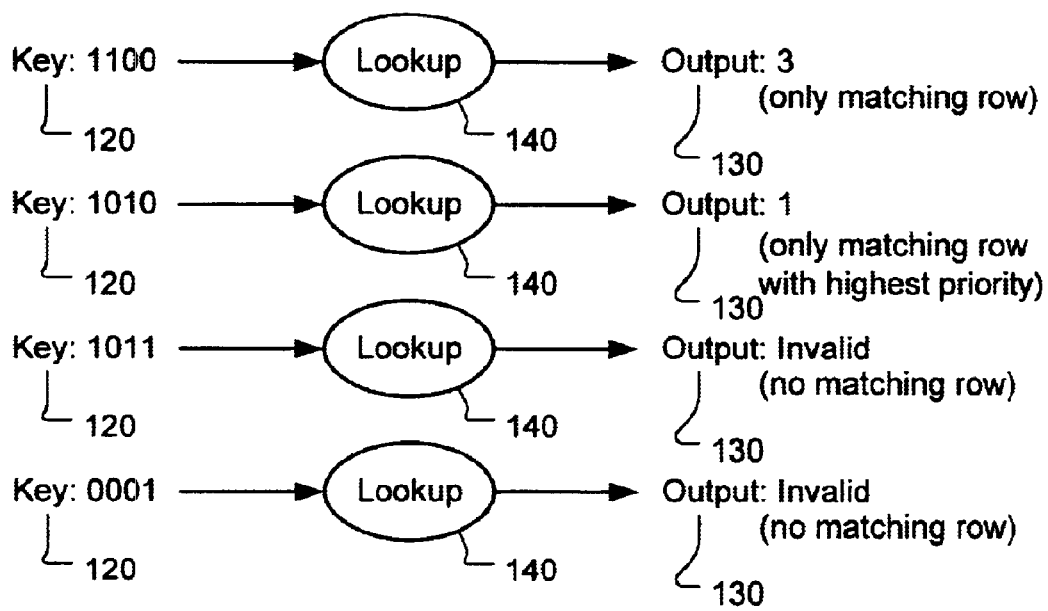
FIG. 1b shows some examples of lookup operations in the binary CAM of FIG. 1a and the output that results from the operations.
Figure 2A:
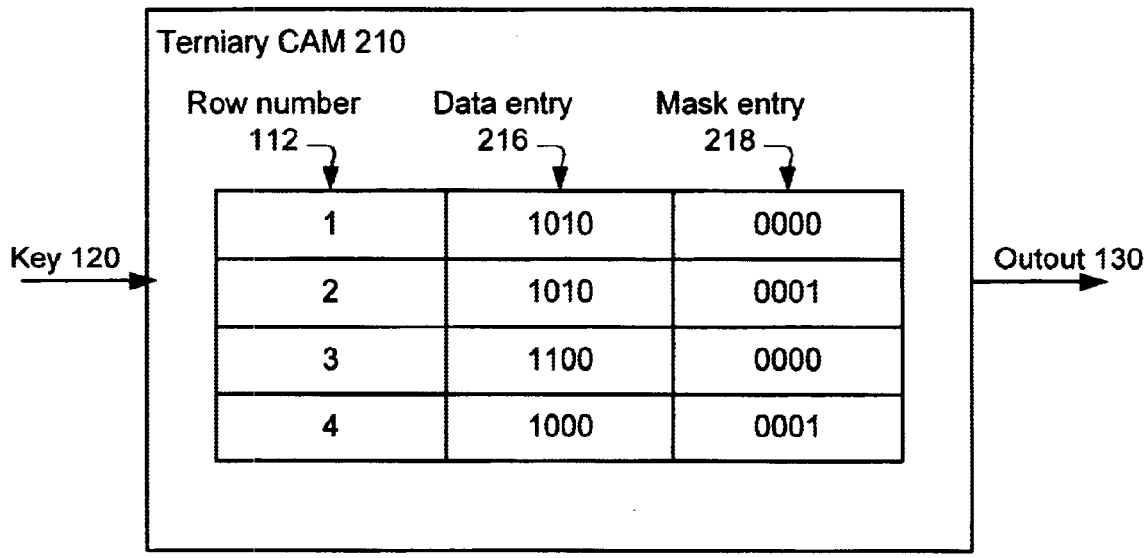
FIG. 2a shows a second example of a content addressable memory (CAM), which holds ternary information.
Figure 2B:
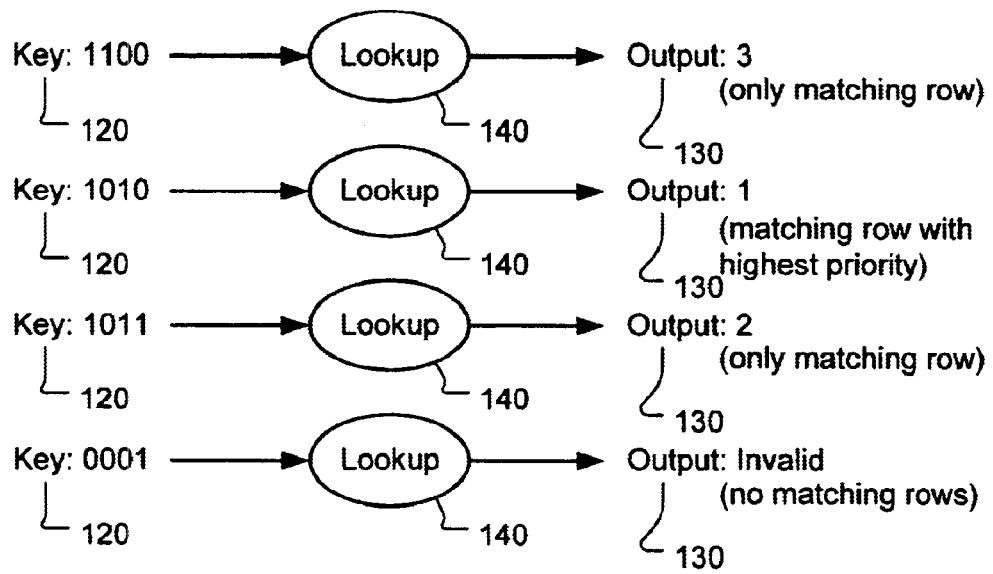
FIG. 2b shows some examples of lookup operations in the ternary CAM of FIG. 2a and the output that results from the operations.

A binary CAM, as described with regard to FIGS. 1a and 1b above, is used in some embodiments of the invention. A ternary CAM, as described with regard to FIGS. 2a and 2b above, may be used. Other types of CAM may also be used, including but not limited to: ternary CAMs where the entry held is binary and the key is ternary; ternary CAMs where both the entry held and the key are ternary; and binary/ternary CAMs that are configurable either to hold a binary entry and to determine that the key field and the entry field match based on a binary determination, or to hold a ternary entry and to determine the key field and the entry field match based on a ternary determination.

Known CAM arrays and CAM cells use various techniques to store information into the CAM, to read out information from the CAM and to modify or rearrange information in the CAM. Any of these techniques as well as techniques, CAM cells and CAM arrays developed in the future may be used in various embodiments of the invention.

Figure 4:
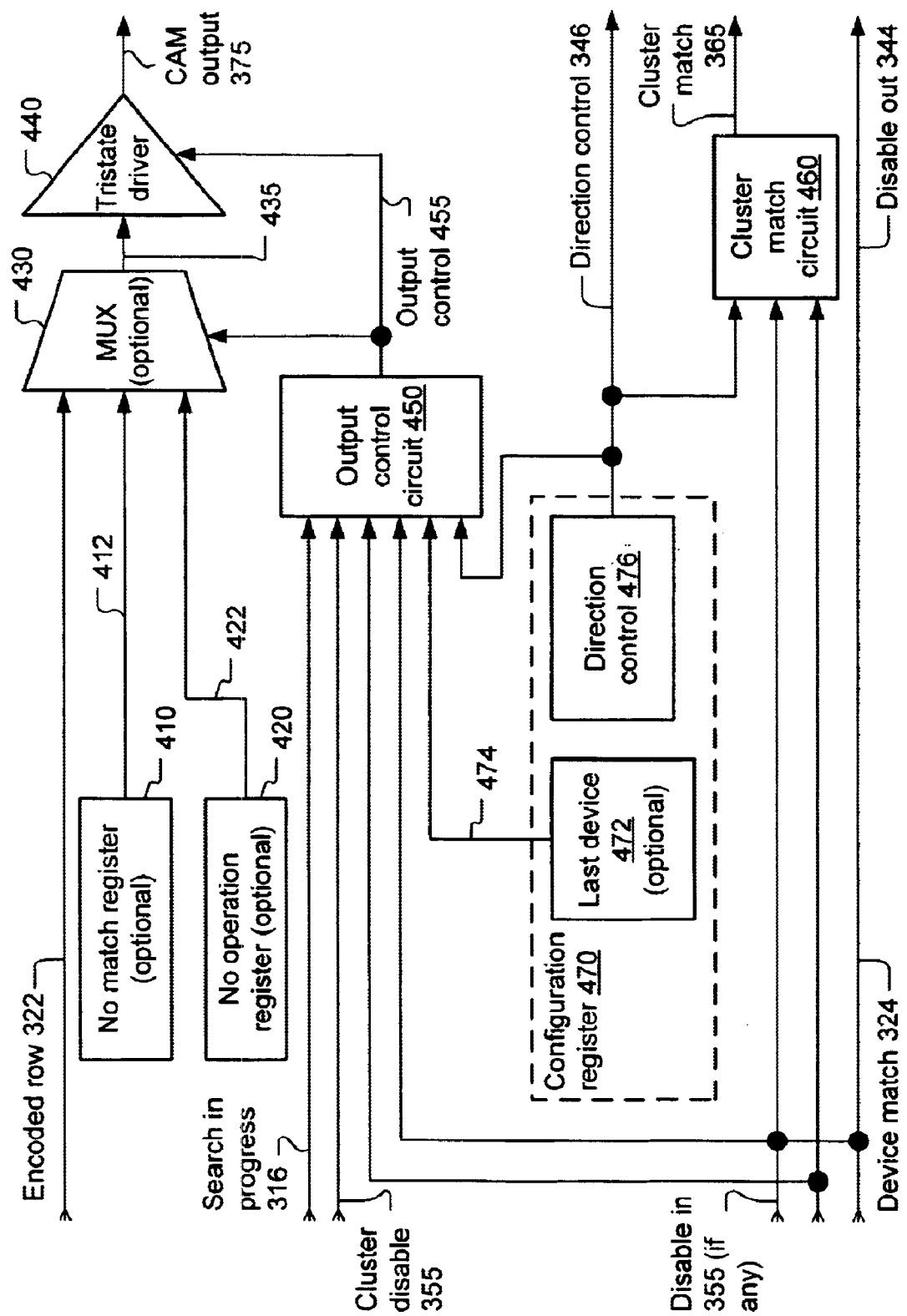
FIG. 4 shows the logical components and their interconnections for an exemplary cascade circuit according the invention.

FIG. 4 is a logic diagram of cascade circuit 330, according to an embodiment of the invention. FIG. 5 shows simplified truth tables that illustrate the functionality of portions of cascade circuit 330. In FIG. 5, an "X" indicates a don't care; that is, the output signal generated by the circuit has the value indicated regardless of the value of the input signal that corresponds to the "X."

Cascade circuit 330 includes tri-state driver 440, output-control circuit 450, cluster-match circuit 460 and configuration register 470.

The cascade circuit may also include no-match register 410, no-operation register 420 and multiplexer 430. These components allow the lowest priority device within the CAM system, which has its last-device bit 472 asserted within configuration register 470, to provide the contents of the appropriate register as the value on CAM output 375 when there is no match found in a lookup operation, or when there is no lookup operation in progress.

When used, multiplexer 430 has data inputs that come from encoded-row signal 322, and from one or more of the outputs of no-match register 410 or no-operation register 420. The data input of tri-state driver 440 is the output of the multiplexer when used, otherwise the data input is encoded row 322. The control inputs of the multiplexer and the tri-state driver are the output of control circuit 450.

The outputs of configuration register 470 go to control circuit 450, cluster-match circuit 460 and programmable disable connections 340. The output of cluster-match circuit 460 goes to cluster-match connection 360. Device-match signal 324 becomes disable-out signal 344 and goes to any of the programmable disable connections 340 that are programmed as outputs.

Cluster-match circuit 460 generates cluster-match signal 365 based on any disable-in signals received by this instance of CAM device 300, device match signal 324 and direction-control signals 346. Cluster-match signal 365 is generated according to truth-table 560. Cluster-match signal 365 is asserted either if device-match signal 324 is asserted, or if one or more of the disable-in signals 342 (if any) received by this instance of the CAM device are asserted.

Like cluster-match circuit 460, output-control circuit 450 generates output-control signal 455 based on any disable-in signals received by this instance of CAM device 300, device match signal 324, and direction-control signals 346. Output-control circuit additionally bases output-control signal 455 on search-in-progress signal 316, cluster-disable signal 355, and last-device signal 474.

As shown in truth table 550, output-control circuit 450 generates output-control signal 455 such that tri-state driver 440 is in the tri-state mode when cluster-disable signal 355 is asserted, when any of the disable-in signals 342 received are asserted, or when both device-match signal 324 and last-device signal 324 are not asserted.

When cluster-disable signal 355 is not asserted and when no asserted disable-in signals 342 are asserted, then output-control signal 455 enables tri-state driver 440 to drive CAM output 375 onto the bus and controls multiplexer 430 such that the appropriate value is selected to become CAM output 375. When device-match signal 324 is asserted, then this appropriate value is encoded row 322, otherwise the appropriate value is either no-match value 412, the current value of which is held in no-match register 410, or no-operation value 422, the current value of which is held in no-operation register 420.

The values held in no-match register 410, no-operation register 420 and configuration register 470 are typically but not necessarily programmed when the system configuration is first set up. Configuration register includes last-device bit 472, which generates last-device signal 474, and direction-control bits 476, which generate direction-control signals 346. Each programmable-disable connection 340 has a corresponding direction-control bit 476 and direction-control signal 346.

While FIGS. 4 and 5 are drawn as logic diagrams and truth tables of cascade circuit 330, each is best interpreted as a functional diagram or a logical specification of the circuit. In various embodiments of the invention, the cascade circuit may be implemented with NAND gates and NOR gates, or may provide clocked or synchronous operation by latching various signals, or may use other techniques. In particular, output-control circuit 450 and cluster-match circuit 460 may be implemented as networks of logic gates, read only memory (ROM) lookup tables, combinatorial circuits, clocked circuits, or any combination of one or more thereof.

Figure 6:
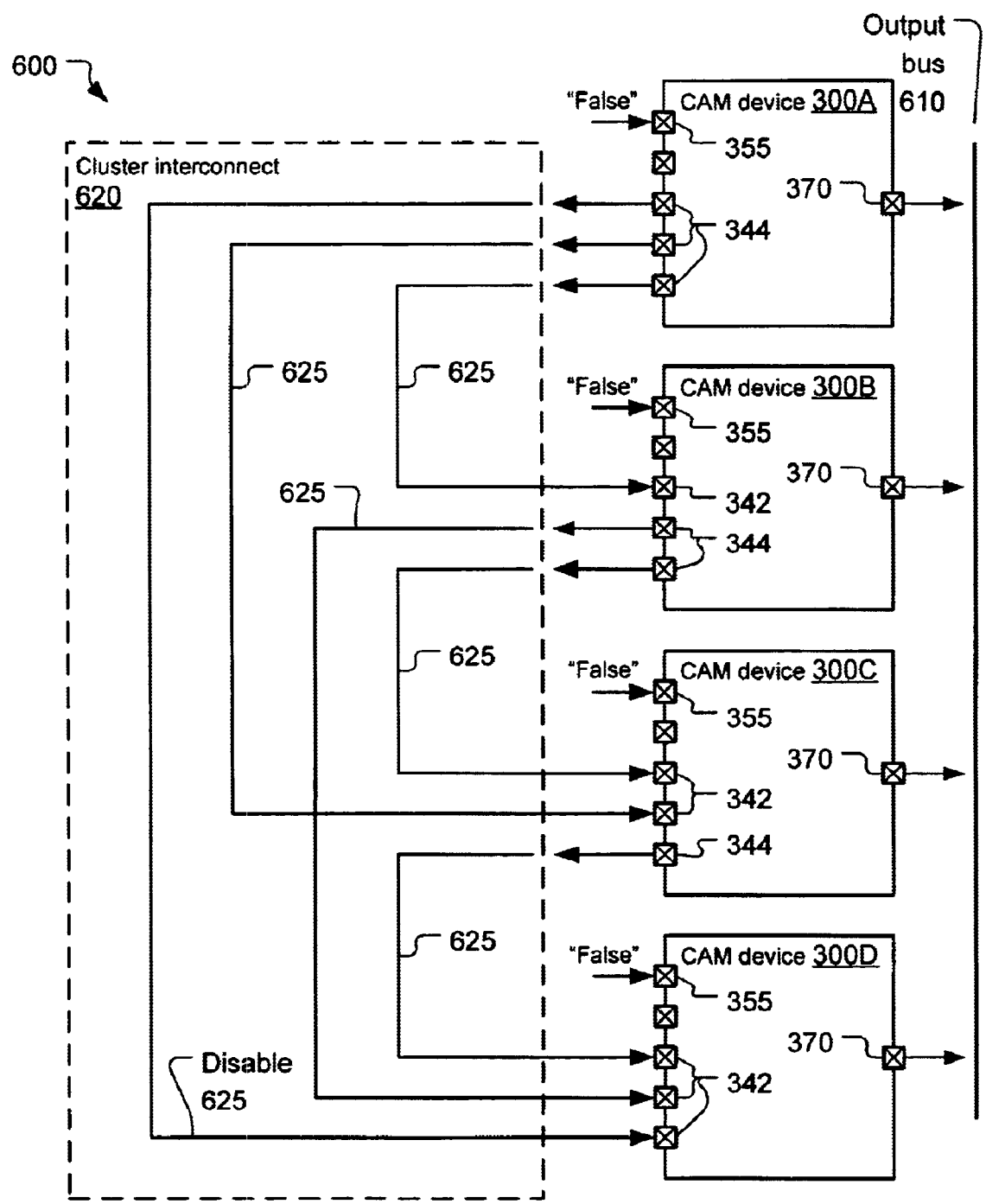
FIG. 6 shows the functional components and their interconnections for a single-cluster CAM memory system according to an embodiment of the invention, and for a cluster of CAM devices for use in a larger CAM memory system according to another embodiment of the invention.

FIG. 6 shows a functional block diagram of an arrangement of CAM devices. CAM system/cluster 600 is a single-cluster memory system according to an embodiment of the invention, or alternatively a cluster of CAM devices that can be used to form a multi-cluster CAM system according to another embodiment of the invention. CAM system/cluster 600 includes output bus 610 of CAM system/cluster 600, cluster interconnect 620 and four instances of CAM device 300.

The highest priority CAM device, that is device 300A, has all of its programmable disable connections 340 programmed as outputs. These three connections generate three instances of disable signal 625. Each of these signals is coupled, via cluster interconnect 620, to a programmable disable connection 340 of another, lower-priority instance of CAM device 300 within CAM system/cluster 600.

The next-highest priority CAM device, that is device 300B, has one of its programmable disable connections 340 programmed as an input and two programmed as outputs. The input connection is coupled, via cluster interconnect 620, to receive one of the disable signals 625 generated by CAM device 300A. The two output connections generate two instances of disable signal 625. Each of these two signals is coupled, via cluster interconnect 620, to a programmable disable connection 340 of another, lower-priority instance of CAM device 300 within CAM system/cluster 600.

The next-highest priority CAM device, that is device 300C, has two of its programmable disable connections 340 programmed as inputs and one programmed as an output. The input connections are coupled, via cluster interconnect 620, to receive either the disable signal 625 generated by CAM device 300A or the disable signal 625 generated by CAM device 300B. The output connection generates a disable signal 625, which is coupled via cluster interconnect 620 to a programmable disable connection 340 of CAM device 300D.

The lowest priority CAM device, that is device 300D, has all of its programmable disable connections 340 programmed as inputs. Each of these connections is coupled, via cluster interconnect 620, to receive one of the disable signals 625 generated by CAM device 300A, 300B or 300C.

In single-cluster CAM systems, the cluster-disable signal received by each CAM device is not asserted. Also, the cluster-match signal generated by the lowest priority device within the system can be used as a match-found signal for the CAM system.

Figure 7:
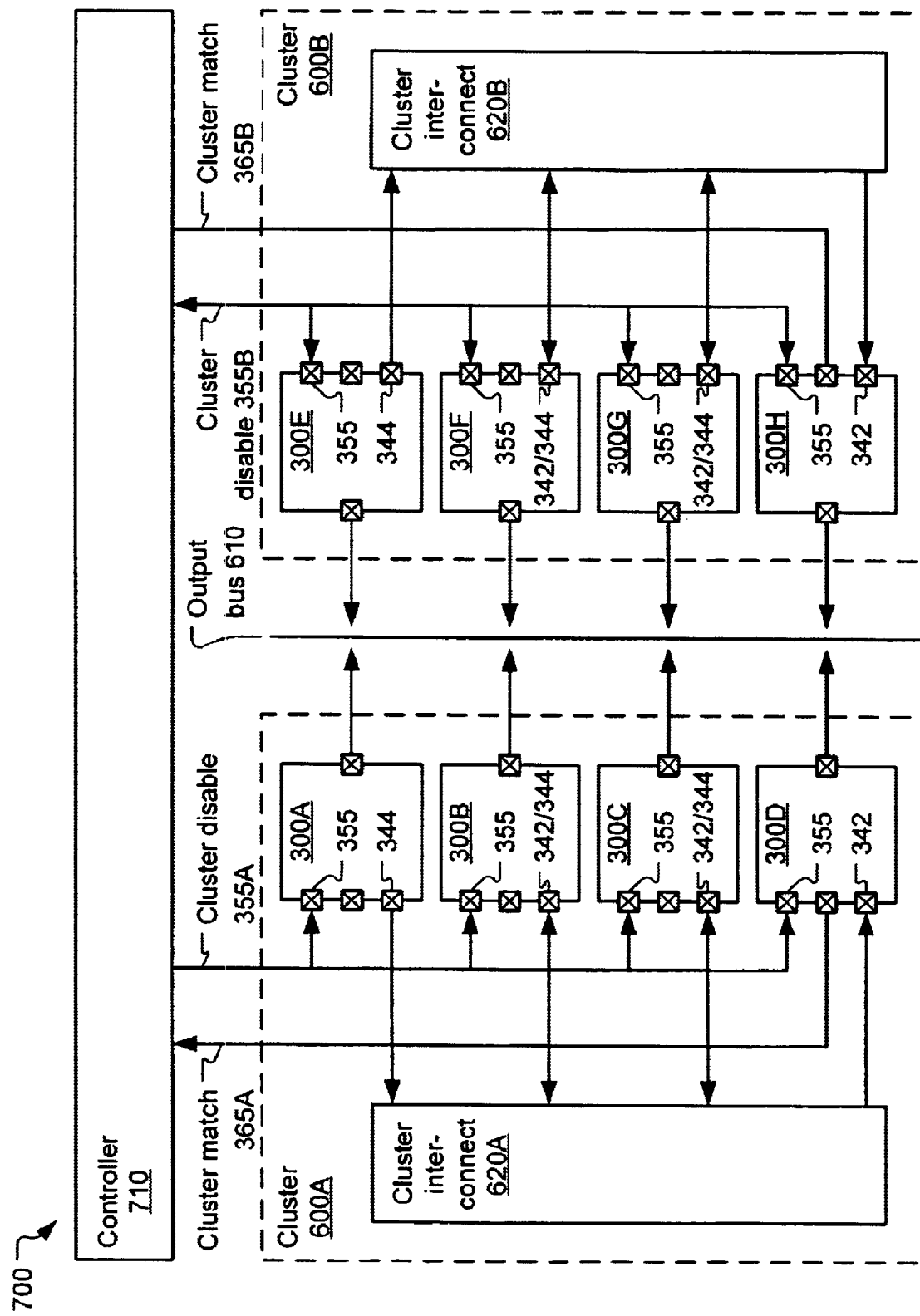
FIG. 7 shows the functional components and their interconnections for a two-cluster CAM memory system according to yet another embodiment of the invention.

FIG. 7 shows a functional block diagram of a two-cluster CAM system according to another embodiment of the invention. CAM system 700 includes controller 710 and two instances of CAM cluster 600. CAM cluster 600A generates cluster-match signal 365A, which is coupled to controller 710. CAM cluster 600A is also coupled to controller 710 to receive cluster-disable signal 355A. Similarly, CAM cluster 600B generates cluster-match signal 365B for the controller, and receives cluster-disable signal 355B from the controller.

Controller 710 may be an application specific integrated circuit (ASIC), a programmed microcontroller, a processor, a network processor, a state machine or a coordination circuit. It may be sequential or combinatorial. Controller 710 may be any device or circuit that enables the highest priority cluster that has a matching entry during a lookup operation and that disables any clusters that are lower in priority than that cluster.

In embodiments of the invention that use one no-match register 410, no-operation register 420, or both, controller 710 also enables the lowest priority cluster whenever no other cluster has a match. This enabling occurs regardless of whether or not the lowest priority cluster contains a match. This allows the lowest priority device within CAM system 700, which has its last-device bit 472 asserted, to provide the contents of the appropriate one of these two registers as the value on output bus 610 when there is no match found in a lookup operation, or when there is no lookup operation in progress.

In some embodiments of the invention, the cluster-enable signal for the highest priority cluster is always asserted and need not be under the control of the controller. Similarly, the cluster-match signal of the lowest-priority cluster need not be received by the controller.

Figure 8:
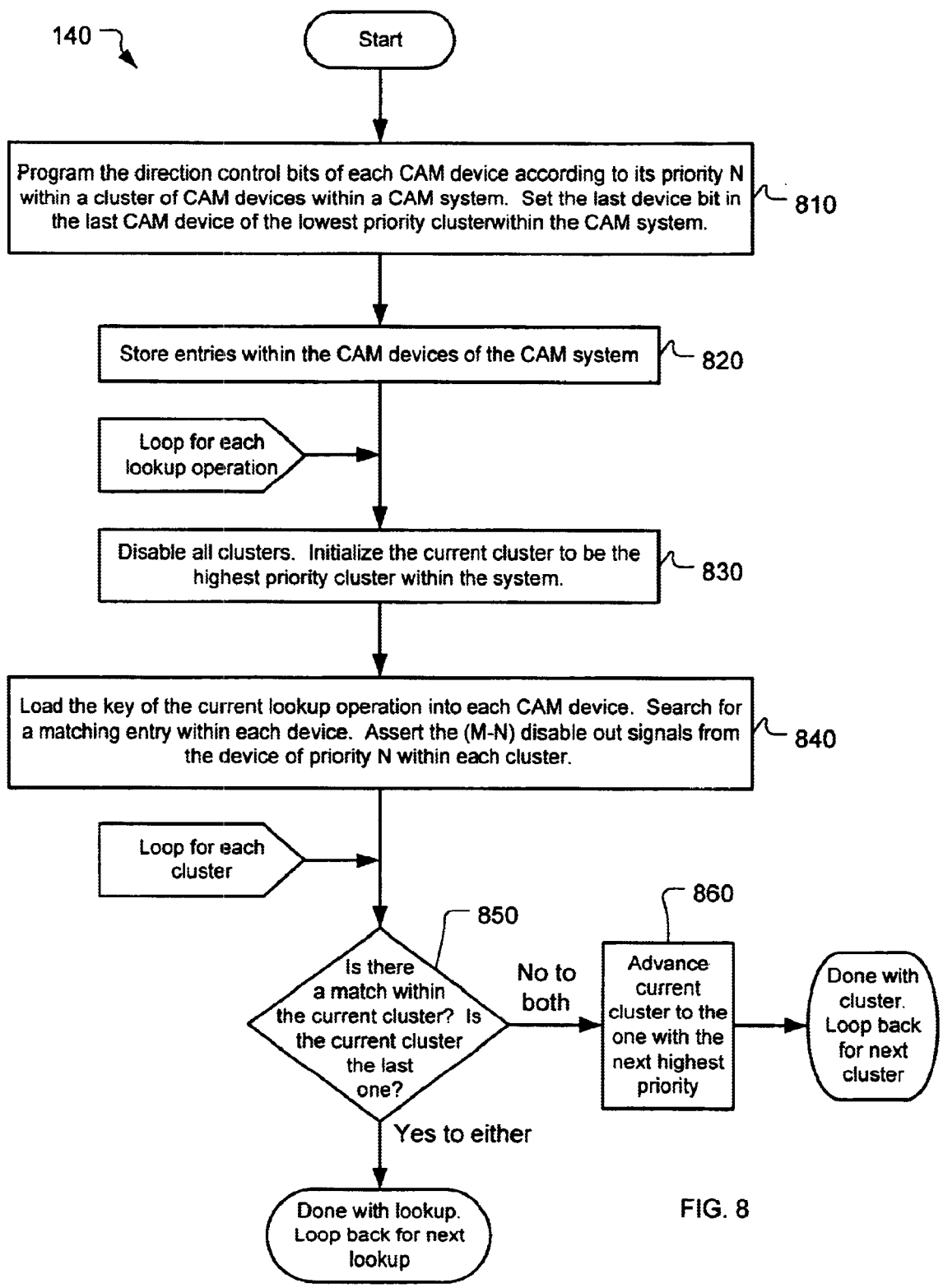
FIG. 8 shows the sequence of operations included in an exemplary lookup operation according to the invention.

FIG. 8 is a simplified flow chart of a lookup operation according to an embodiment of the invention.

In operation 810, the structure of the CAM system is initialized or configured. Direction control bits 476 within configuration register 470 are set to control which instances of programmable disable connections 340 are to function as inputs and which are to function as outputs. These bits are set according to the priority of the CAM device within its cluster of CAM devices, as described above with reference to FIG. 6.

In embodiments of the invention that include no-match register 410, no-operation register 420 or both, these registers and last-device bit 472 within configuration register 470 are also initialized in operation 810. Last-device bit 472 is initialized to be asserted within the CAM bank that is the last within the CAM memory system, and to be not asserted within every other device. No-match register 410 is set to be the value the CAM system drives onto output bus 610 when there is no entry within the CAM system that matches the key of the current lookup operation. No-operation register 420 is set to be the value the CAM system drives onto output bus 610 when there is no lookup operation in progress.

In operation 820, the contents of the CAM system is initialized or stored. Entries are stored in the various CAM devices within the CAM system, with the device that holds the entry chosen and the row within the device chosen according to the relative priorities of the entries.

Operation 830 begins the loop of operations that are repeated for each occurrence of a lookup operation. All clusters (or all but the highest priority cluster) are disabled via the cluster enable signals. The current cluster, which will change during the lookup operation, is initialized to be the highest priority cluster.

In operation 840, the key of the current lookup operation is loaded into each CAM device, which searches the CAM entries that the device holds to find the highest priority entry within the device that matches the key. If a device finds a matching entry, then the device asserts both the disable-out signal and the cluster-match signal. Each device also asserts the cluster-match signal when any disable-in signal that is received is asserted. If the device finds a matching entry and receives no asserted disable-in signal or cluster-disable signal, then the device drives the encoded value of the matching row onto the output bus of the CAM system.

Operation 850 begins the loop of operations that are repeated for each cluster during each lookup operation. In operation 850, a decision is made as to whether or not the current cluster is the last cluster and whether or not there is, according to the cluster-match signal of the current cluster, a match in the current cluster.

If either of these conditions is detected, then the current lookup operation is complete and the next lookup operation begins with another occurrence of operation 830. If neither of these conditions is detected then, in operation 860, the current cluster is advanced to be the cluster with the next highest priority. Next, the current lookup operation continues with another occurrence of operation 850.

In some embodiments of the invention, each occurrence of operations 850 and 860 occurs sequentially; that is, a clock, a state machine or a programmed processor controls the transitions between these operations. In other embodiments, operations 850 and 860 are implemented using combinatorial logic or asynchronous circuits. Some embodiments perform a complete lookup operation in little or no more time than the time required for an individual CAM device to complete its loading and matching operation.

The scope of the invention is set forth by the following claims and their legal equivalents. The invention is subject to numerous modifications, variations, selections among alternatives, changes in form, and improvements, in light of the teachings herein, the techniques known to those skilled in the art, and advances in the art yet to be made. The figures and descriptions herein are not intended to be exhaustive or to limit the invention to the designs, forms and embodiments disclosed; rather, they are intended to illustrate the invention by presenting specific details.

What is claimed is:

1. A CAM system for generating an output on a bus in response to a key, the CAM system comprising:
   at least two clusters that each include M CAM devices, wherein each CAM device has a priority N within the cluster to which it belongs, where N ranges from 1 to M, and each CAM device includes:
   i) a CAM array configured to hold entries and to determine if each entry matches the key;
   ii) (M−1) disable connections, where the CAM device of priority N has (N−1) of the disable connections programmed as inputs configured to receive disable-in signals from the (N−1) higher-priority CAM devices within the cluster, and has the remaining (M−N) disable connections programmed as outputs configured to provide a disable-out signal to the (M−N) lower-priority CAM devices within the cluster; and
   iii) a cascade circuit configured to disable the CAM device from driving the output onto the bus when any of the disable-in signals received by the CAM device are asserted; and
   a controller configured to receive a cluster-match signal from the clusters and to generate a cluster-disable signal for the clusters, wherein the cluster-disable signal for a particular cluster is asserted when any cluster-match signal received by the controller from any cluster having higher priority than that particular cluster is asserted;

wherein each CAM device further includes a connection configured to receive the cluster-disable signal for the cluster containing the CAM device and a connection configured to provide the cluster-match signal for that cluster; and wherein each cascade circuit is further configured to disable the CAM device from driving the output onto the bus when the cluster-disable signal is asserted.

2. The CAM system of claim 1, wherein the cluster-disable connection is a programmable connection and in a CAM memory system having only a single cluster the cluster-disable connection can be configured to support an additional CAM device within the single cluster.

3. The CAM system of claim 1, wherein the cluster-match connection is a programmable connection and in a CAM memory system having only a single cluster the cluster-match connection can be configured to support an additional CAM device within the single cluster.

4. The CAM system of claim 1, wherein each CAM device is an integrated circuit having the same design as the other CAM devices.

5. The CAM system of claim 1, wherein the maximum number of entries that can be held within at least one of the CAM devices is not equal to the maximum number of entries that can be held within another one of the CAM devices.

6. The CAM system of claim 1, wherein each CAM device further includes a priority encoder configured such that, the priority encoder selects one of the matching entries, encodes the selected entry into an encoded row, and drives the encoded row onto the bus as the output when at least one entry within the CAM array matches the key and when enabled by the cascade circuit.

7. The CAM system of claim 1, wherein each CAM device further includes a no-operation register that is configured to hold a no-operation value and that drives the no-operation value onto the bus as the output when there is no lookup operation in progress and the CAM device is the last CAM device in the CAM system.

8. The CAM system of claim 1, wherein each CAM device further includes a no-match register that is configured to hold a no-match value and that drives the no-match value onto the bus as the output when there is no entry in the CAM system that matches the key and the CAM device is the last CAM device in the system.

9. The CAM system of claim 1, wherein the entries and the key are binary, and the rows are further configured to determine that the key and the entry match when equal.

10. The CAM system of claim 1, wherein at least one of the key and the entry is ternary, and the rows are further configured to determine that the key and the entry match when bits selected by a mask within the key field and the entry field are equal.

11. The CAM system of claim 1, wherein the rows are further configurable either to hold a binary entry and to determine that the key field and the entry field match based on a binary determination, or to hold a ternary entry and to determine the key field and the entry field match based on a ternary determination.

12. A method of generating a CAM output on a bus in response to a key, the method comprising:

holding entries in at least one cluster of M CAM devices, wherein each CAM device has a priority N within the cluster to which the CAM device belongs, where N ranges from 1 to M;

programming (N−1) programmable connections within each CAM device to receive a disable-in signal;

programming (M−N) programmable connections within each CAM device to generate a disable-out signal;

loading into each CAM device a key;

searching for entries within each CAM device that match the key;

asserting from each CAM device the (M−N) disable-out signals only when a matching entry is found within that CAM device;

receiving into each CAM device (N−1) disable-in signals, each being the disable-out signal from one of the (N−1) higher priority devices within the cluster to which that CAM device belongs;

encoding one of the matching rows and driving the encoded row onto the bus when there is at least one matching entry within a CAM device and when no disable-in signal received by that CAM device is asserted.

13. The method of claim 12, further comprising:

receiving into each CAM device a cluster-disable signal for the cluster of CAM devices to which the CAM device belongs;

generating from each cluster a cluster-match signal whenever at least one entry held within the CAM devices within that cluster matches the key;

not asserting the cluster-disable signal of the cluster that is the highest priority cluster that has an asserted cluster-match signal, and asserting the cluster-disable signals of the other clusters.

14. A CAM system for generating an output on a bus in response to a key, the CAM system comprising:

at least two clusters that each include M CAM means, wherein each CAM means has a priority N within the cluster to which it belongs, where N ranges from 1 to M, and each CAM means includes:

i) a means for holding entries and for determining if each entry matches the key;

ii) (M−1) means, each programmable either as an input for receiving a disable-in signal from one of the (N−1) higher-priority CAM means within the cluster or as an output for providing a disable-out signal to one of the (M−N) lower-priority CAM means within the cluster; and iii) means for driving the output from the CAM means onto the bus, wherein the driving means does not drive the bus when any of the disable-in signals received by the CAM means are asserted; and means for generating a cluster-disable signal for each of the clusters, wherein the cluster-disable signal for each cluster is asserted when the cluster-match signal received by the controller from any cluster having higher priority than that cluster is wherein each CAM means further includes means for receiving the cluster-disable signal for the cluster containing the CAM means and means for providing the cluster-disable signal for that cluster; and wherein each driving means does not drive the output onto the bus either when the cluster-disable signal is asserted.

* * * * *